United States Patent [19]

Voigt

[11] 4,145,653
[45] Mar. 20, 1979

[54] WAVEFORM ANALYZER FOR ROTATING ELECTRICAL CIRCUITRY

[75] Inventor: James R. Voigt, Cleveland, Wis.

[73] Assignee: Kohler Co., Kohler, Wis.

[21] Appl. No.: 724,087

[22] Filed: Sep. 16, 1976

[51] Int. Cl.² .................. G01R 31/02; G08B 21/00
[52] U.S. Cl. .................. 324/158 MG; 322/99; 324/96
[58] Field of Search .......... 324/158 MG, 96; 322/99, 322/28; 318/490, 138, 480; 340/269, 271, 366 D, 373, 81, 375, 378, 331, 335, 340; 116/115; 73/499; 46/53, 58, 228; 362/35, 800; 250/480; 290/55

[56] References Cited

U.S. PATENT DOCUMENTS

| | | | |
|---|---|---|---|
| 2,423,528 | 7/1947 | Stewart | 362/35 |
| 2,473,631 | 6/1949 | Beemer | 340/366 D |
| 2,508,071 | 5/1950 | Martin et al. | 340/366 D |
| 2,726,483 | 12/1955 | Hughes et al. | 46/228 |
| 3,488,586 | 1/1970 | Watrous et al. | 324/96 |
| 3,656,051 | 4/1972 | Pratt | 322/28 |
| 3,733,518 | 5/1973 | Polulyakh et al. | 322/99 |

Primary Examiner—Rudolph V. Rolinec
Assistant Examiner—Ernest F. Karlsen
Attorney, Agent, or Firm—Quarles & Brady

[57] ABSTRACT

Two monitor circuits, each having a light emitting diode, are connected to the inputs and outputs of an SCR current control circuit on a brushless a-c generator. The current control circuit and the attached monitoring circuits are mounted on a rotating shaft and information regarding the operation of the rotating current control circuit is obtained by observing the light patterns generated by the light emitting diodes.

13 Claims, 15 Drawing Figures

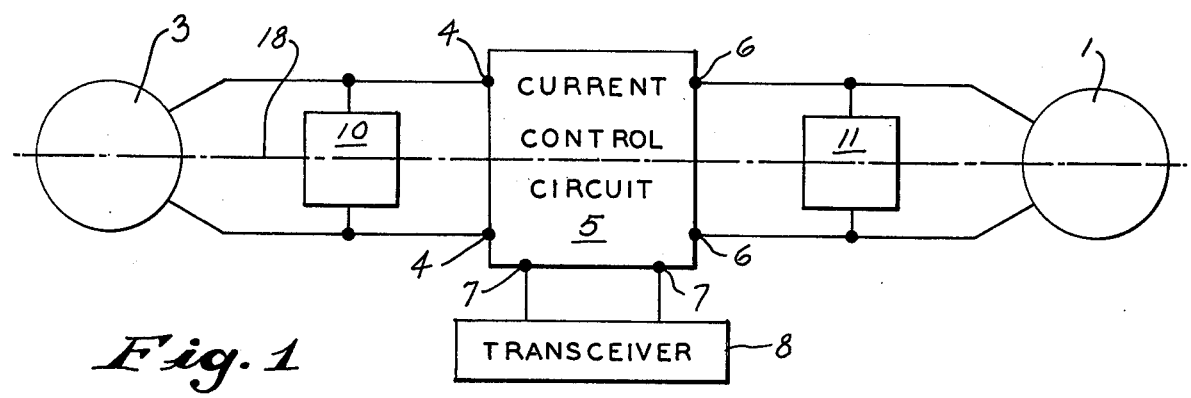
Fig. 1
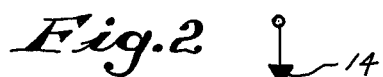
Fig. 2
Fig. 9
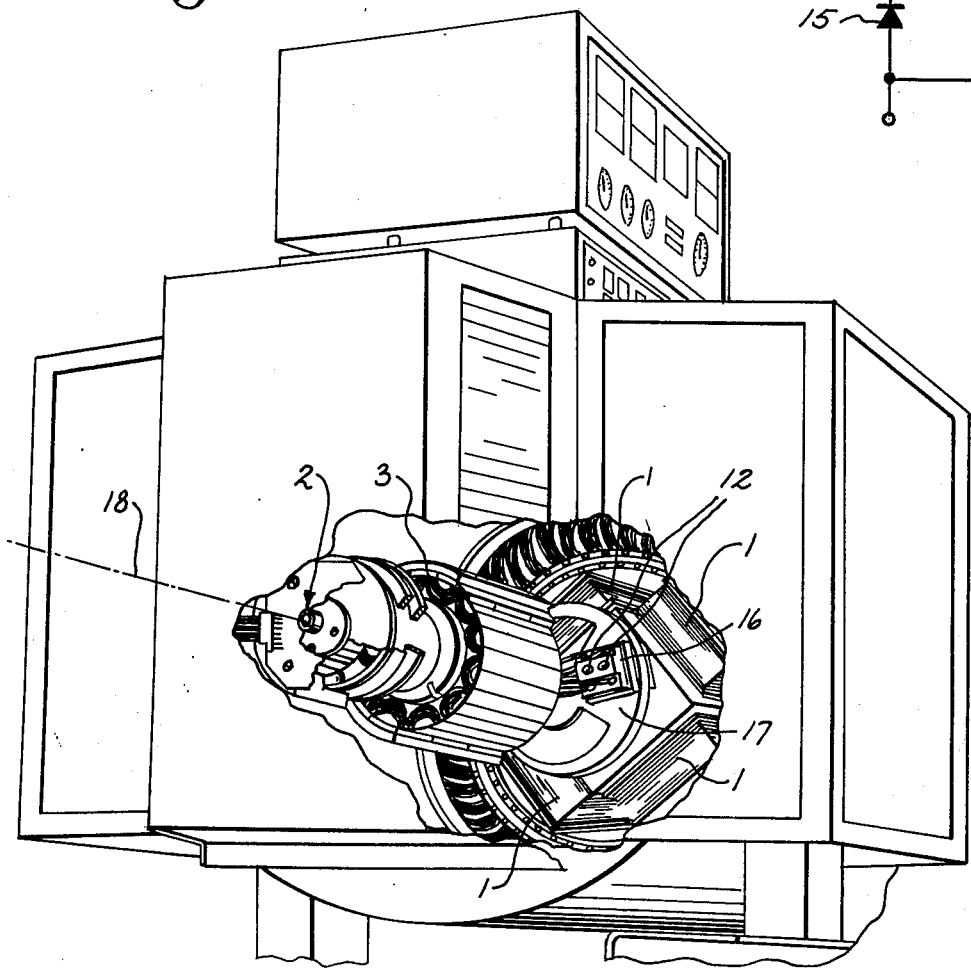

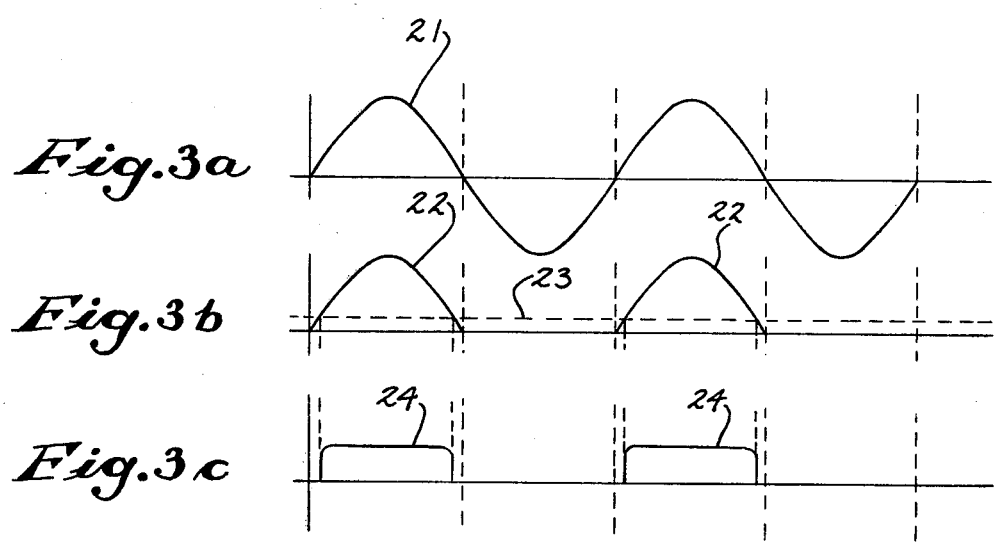
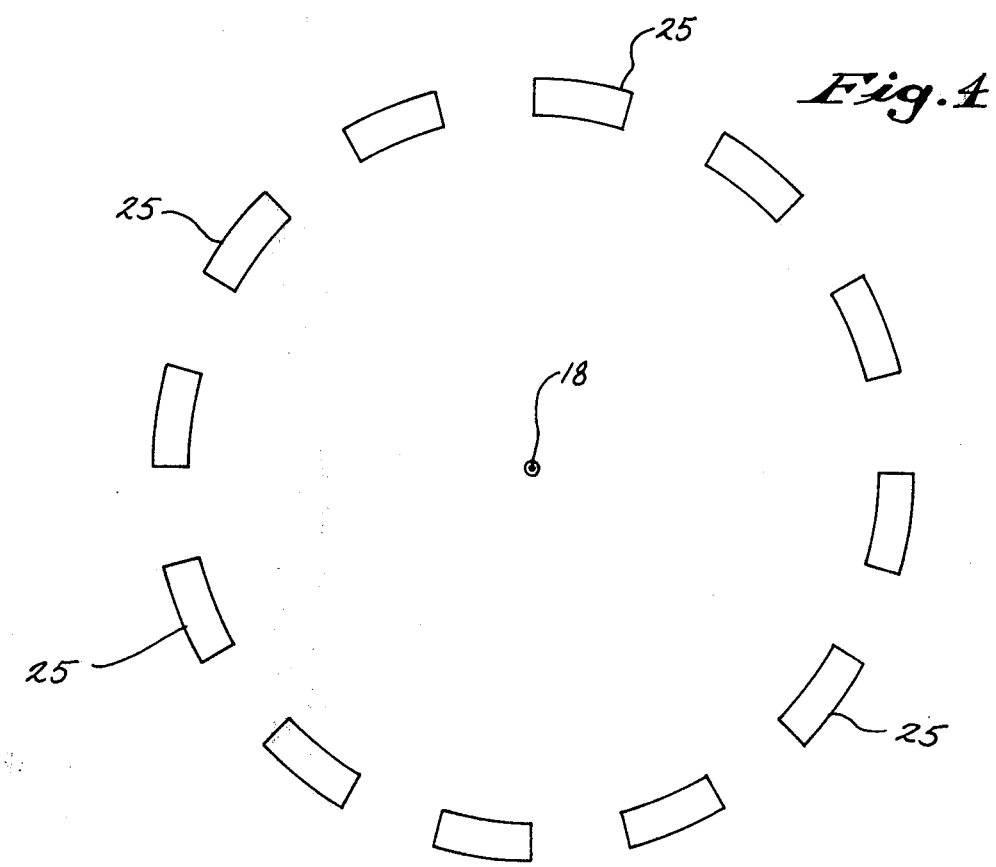

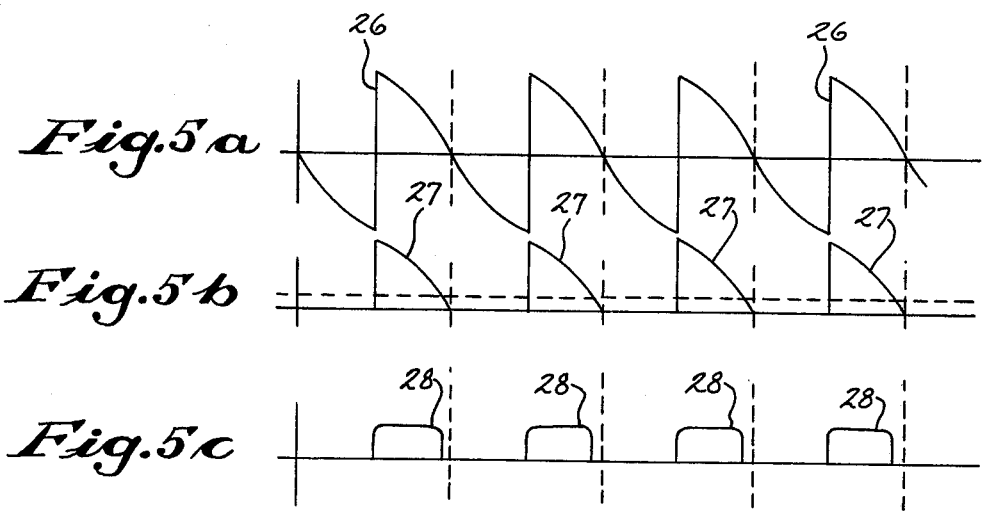
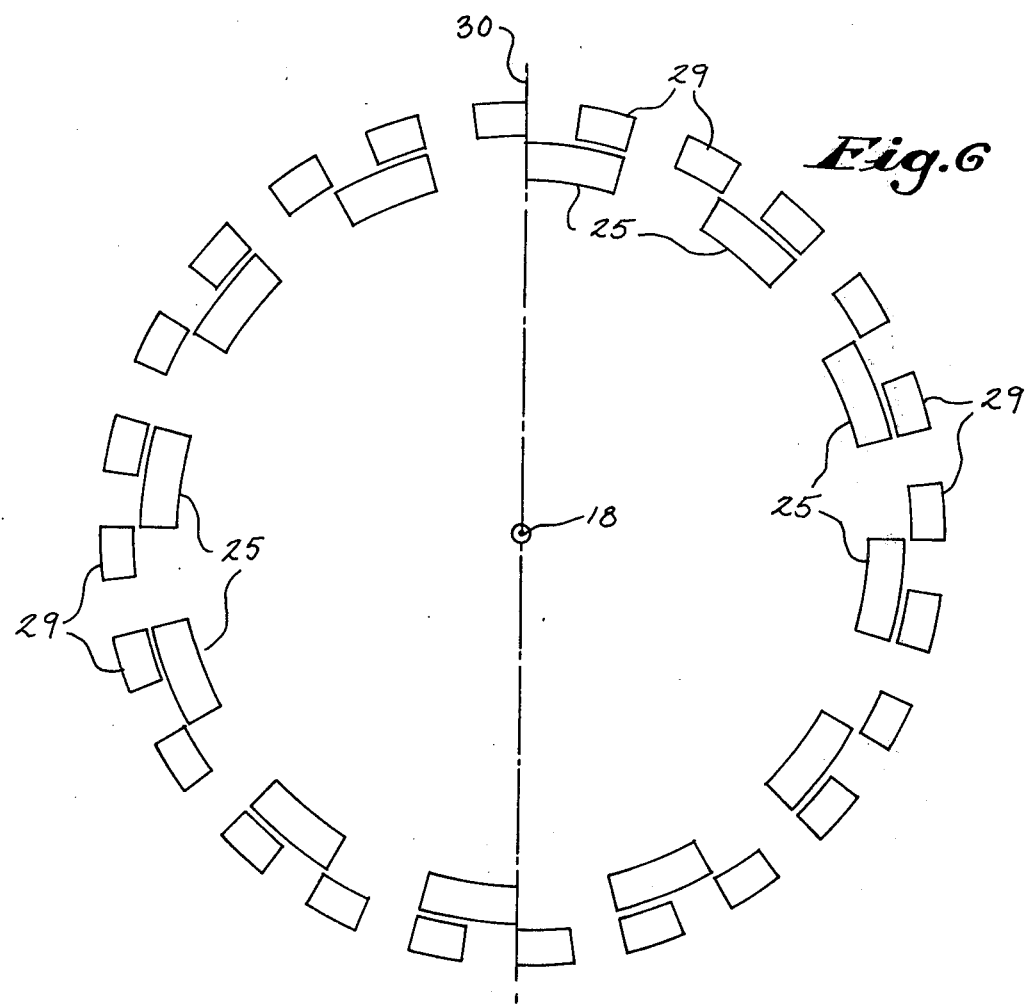

WAVEFORM ANALYZER FOR ROTATING ELECTRICAL CIRCUITRY

BACKGROUND OF THE INVENTION

This invention relates to an apparatus for monitoring and analyzing voltage waveforms within electrical circuitry located on rotating components of machines. More particularly, this invention has an application for monitoring and analyzing voltages and time responses within the rotating circuitry of a brushless alternating current generator.

In a fast response feedback controlled generator such as that described in U.S. Pat. No. 3,656,051, an exciter armature, an alternator field winding and an electronic current control circuit are all located on a rotating shaft. The exciter armature generates an a-c output voltage, which is rectified and regulated by the electronic current control circuit and is then supplied to the alternator field winding. Rotation of the alternator field winding generates output power in the fixed alternator armature which is magnetically coupled to it, and the magnitude of this power is controlled by means of the current control circuit.

Although the electronic components contained in the current control circuit are highly reliable and are suitable for rotation at high speeds, it is desirable to periodically monitor the operation of the current control circuit. Malfunctions may occur in the current control circuit or the windings to which it attaches. In some instances such malfunctions may only be diagnosed by analyzing the voltage waveforms associated with the current control circuit while it is rotating. Because the generator has no brushes or commutators there is no means for analyzing the voltage waveforms of the rapidly rotating circuit. Brushes or slip rings could be added to provide voltage monitoring points, but this would defeat the purpose of the brushless generator, which is to eliminate components subject to wear and periodic replacement.

Also, engine driven electric generators are often used in emergency and standby operations. As a result, test equipment such as an oscilloscope, is usually not available for service in the field.

SUMMARY OF THE INVENTION

The present invention relates to a means for monitoring a rotating electrical circuit and for analyzing waveforms associated with the circuit. More particularly, a monitoring circuit is mounted to the rotating shaft and includes a light source which connects to the rotating electrical circuit to receive a periodic voltage that is synchronized with the rotation of the shaft. The light source is responsive to the applied periodic voltage to generate a substantially stationary, circular light pattern about the axis of rotation.

The light source may be a light emitting diode (LED) which connects to the rotating electrical circuit, such that the timing and duration of the emitted light are a function of critical voltages generated there within. The resultant light pattern enables the observer to determine important information about the electrical performance without the need for separate electronic test equipment and without the need for modifying or otherwise disturbing the operation of the generator under test.

A general objective of the invention is to provide a durable and economical means for monitoring electrical performance of a rotating electrical circuit. The monitoring circuit may be constructed from passive devices such as resistors, diodes and capacitors and such reliable solid state devices as light emitting diodes.

A more specific objective of the invention is to provide a visual display within the rotating components of an electric circuit, the display containing information relative to the phase relationship of two voltage waveforms. By connecting a second light source to receive a second synchronized, periodic voltage waveform, a second circular light pattern is generated. By positioning the two light sources close together, but spaced apart radially or axially, the phase relationship between the two stationary light patterns can be easily examined.

Another objective of the invention is to provide a means for monitoring brushless generator performance in the field. By monitoring the input waveform to the generator current control circuit and its output waveform, the performance of the current control circuit and the windings to which it attaches can be checked without shutting down the generator.

Another object of the invention is to shape the stationary light patterns to enhance the information which they provide. By employing diodes to block portions of the applied waveforms and by establishing a voltage threshold above which the applied waveform must go in order to energize the light source, the light pattern can be modified to provide more information.

The foregoing and other objectives and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is therefore made to the claims for interpreting the scope of the present invention.

BRIEF DESCRIPTION OF THE DRAWINGS

FIG. 1 is an electrical block diagram of a brushless electric generator which employs two monitor circuits of the present invention, FIG. 2 is an electrical schematic diagram of a preferred embodiment of the monitor circuit, FIGS. 3a, 3b, 3c are graphic illustrations of waveforms which appear in the input monitor circuit of FIG. 1, FIG. 4 is a schematic representation of the visual display produced by the input monitor circuit of FIG. 1, FIGS. 5a, 5b and 5c are graphic illustrations of waveforms which appear in the output monitor circuit of FIG. 1 for a given generator load condition, FIG. 6 is a schematic representation of the visual display produced by both the input monitor circuit and the output monitor circuit of FIG. 1 for the generator load condition of FIG. 5, FIGS. 7a and 7b are schematic representations of the current control circuit output signal at another generator load condition and the resultant visual display, FIG. 9 is a partial perspective view of the electric generator of FIG. 1.

DESCRIPTION OF THE PREFERRED EMBODIMENT

Figure 7A:
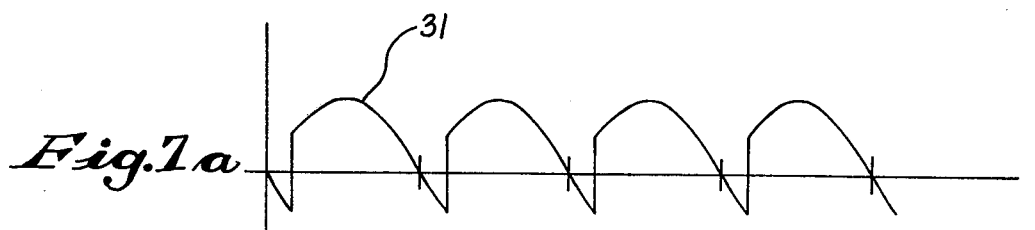

Referring particularly to FIGS. 1 and 9, a brushless a-c generator includes a field winding 1 which is wound on a shaft 2 that is driven by a diesel or gasoline engine (not shown in the drawings). Current is supplied to the field winding 1 by an exciter winding 3 which is also wound on the shaft 2. The output of the exciter winding 3 is an a-c current which is applied to the inputs 4 of a current control circuit 5 which is mounted to the shaft 2 and includes a pair of output terminals 6 that connect to the field winding 1. The current control circuit 5 is a full-wave bridge rectifier circuit comprised of four SCRs (not shown in the drawings) which are controlled through a pair of trigger terminals 7. The current control circuit 5 is responsive to a feedback signal coupled to it by a transceiver 8 to not only rectify the applied exciter winding current, but to also control the average current flowing in the field winding 1 and hence the magnetic flux which it generates. The system is characterized by the fact that no brushes or other mechanical means are employed to electrically communicate with these rotating elements. The feedback signal is either optically or magnetically coupled across an air gap to the rotating current control circuit 5 by the transceiver 8 and hence there is no convenient means available for electrically monitoring the operation of the current control circuit 5 and the other rotating elements. For a more detailed description of this brushless a-c generator, reference is made to the above cited U.S. Pat. No. 3,656,051.

Proper operation of the brushless a-c generator depends largely upon the application of a suitable voltage waveform to the inputs 4 of the current control circuit 5 and the generation of a suitable voltage waveform at its output terminals 6. As will become more apparent from the description below, the duration of the positive portions of the output waveform at terminals 6 and their phase relationship with the positive portions of the input waveform at terminals 4 reveal a great deal about the operation of the current control circuit 5.

An input monitor circuit 10 is connected across the current control circuit input terminals 4 and an output monitor circuit 11 is connected across its output terminals 6. These monitor circuits 10 and 11 are substantially identical and are shown in FIG. 2. Each monitor circuit 10 and 11 includes as its major component a solid state light emitting diode (LED) 12 which is connected in series with a resistor 13 and a rectifier diode 14. The LED 12 and the rectifier diode 14 are oriented to conduct current during the positive portions of the applied voltage waveform and the value of the resistor 13 is selected to protect the LED 12 from excessive forward currents. A second diode 15 is connected in shunt with the LED 12, but is reversed in direction to protect the LED 12 from excessive reverse currents and voltages. The rectifier diode 14 half-wave rectifies the voltage waveform and limits the heat dissipated in the resistor 13.

When the positive portion of the voltage waveform applied to the monitor circuits 10 and 11 exceeds the forward voltage drop across the LED 12 and the rectifier diode 14, the LED 12 emits light. As shown best in FIG. 9, the LEDs 12 of both monitor circuits 10 and 11 are housed in a case 16 which is mounted to a plate 17 near the end of the generator shaft 2. The LEDs 12 face substantially in the direction of the axis of rotation 18 of the shaft 2 and they are displaced radially from one another approximately one-half inch. The LED 12 of the input monitor circuit 10 is spaced approximately four inches from the axis of rotation 18 and the LED 12 of the output monitor circuit 11 is spaced radially outward therefrom. When viewed from the end of the shaft 2, therefore, the LEDs 12 generate two circular, concentric light patterns as the shaft 2 rotates.

Referring particularly to FIGS. 1 and 3, the voltage at the input of the current control circuit 5 has a sinusoidal waveform 21 during normal generator operation. This exciter voltage is applied to the input monitor circuit 10 and is halfwave rectified to provide a voltage waveform 22 which appears across its LED 12. When this voltage waveform 22 exceeds approximately 2 volts, as represented by the dashed line 23, the LED 12 will emit visible light as indicated by a light output waveform 24.

It is an inherent characteristic of the brushless a-c generator that the exciter winding voltage waveform 21 is synchronized with the shaft rotation. A typical generator may have an exciter winding output frequency of 360 Hz at a shaft speed of 1800 revolutions per minute. At this frequency, the human eye would be unable to clearly detect rapid pulses of light such as those indicated by the waveform 24 from a stationary light source. However, the LED 12 is rotated in a circle by the shaft 2, and during each revolution it is illuminated twelve times. When viewed from the end of the shaft 2 as shown in FIG. 4, an observer will see twelve light segments 25 of equal duration, spaced evenly around the circumference of the circular path. Since the exciter winding output frequency is synchronized with the rotational speed of the shaft 2, repeated revolutions of the shaft 2 will result in repeated identical light patterns which are in perfect phase and are stationary under steady-state conditions.

The voltage waveform at the output of the current control circuit 5 has a shape which is dependent upon the magnitude of the feedback signal received from the transceiver 8, which in turn is determined by the load on the generator. For example, at no-load conditions the feedback signal will operate the current control circuit 5 to generate zero average field current to the winding 1. The voltage at output terminals 6 will then have a waveform 26 as shown in FIG. 5a in which the voltage is positive for the same amount of time it is negative. This waveform 26 is applied to the output monitor circuit 11 and is rectified to produce the waveform 27 of FIG. 5b. As a result, the LED 12 in the monitor circuit 11 emits pulses 28 of light as shown in FIG. 5c. This LED 12 is mounted radially outward of the LED 12 in the input monitor circuit 10, and as shown in FIG. 6, it produces a light pattern comprised of twenty-four light segments 29 which encircle the light segments 25. The phase of the output waveform 26 is synchronized with shaft rotation and the pattern formed by the light segments 29 is therefore stationary under steady-state conditions.

This concentric, circular light pattern of FIG. 6 reveals several items of information useful in monitoring and diagnosing generator performance. First, the presence of light segments 25 indicates voltage output from the exciter winding 3. In addition, if the light segments 25 are evenly spaced, uniformly bright, and stationary it indicates that the exciter generator portion of the generator system is operating properly. Further, if any one or more poles of the exciter winding 3 were defective, that defect may reveal itself in the form of irregular brightness or duration of one or more of the light segments 25. By noting which of the twelve light segments is irregular, one can readily determine the defective pole.

Figure 7B:
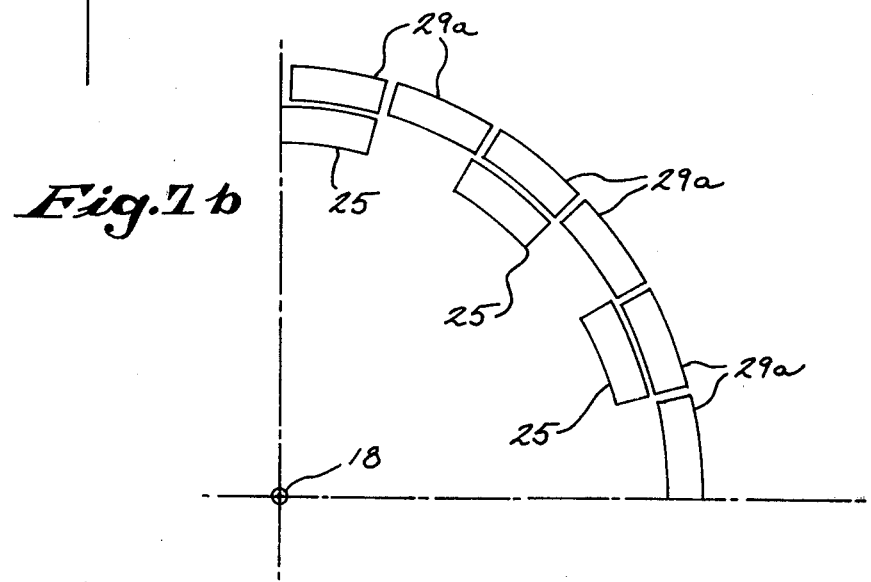

Similarly, the presence of light segments 29 indicates voltage output from the current control circuit 5. Further, the phase and duration of the output light segments 29 yield important and revealing information about the performance of the current control circuit 5. For example, by observing the location of the light segments 29 with respect to a reference mark, such as axis 30 in FIG. 6, phase angles, or changes in phase angles, can be observed. As indicated above and shown in FIG. 6, the light segments 29 indicate that the output waveform 26 is positive and negative for equal portions of eacy cycle. On the other hand, when the generator system is driving a load and has reached a steady-state operating condition, the output of the current control circuit 5 should have a positive average voltage and a waveform 31 such as that shown in FIG. 7a is applied to the output monitor circuit 11. The resulting visual display is shown in FIG. 7b in which the light segments 29A generated by the output monitor circuit 11 are longer in duration than segments 29 generated under no-load conditions.

Figure 8A:
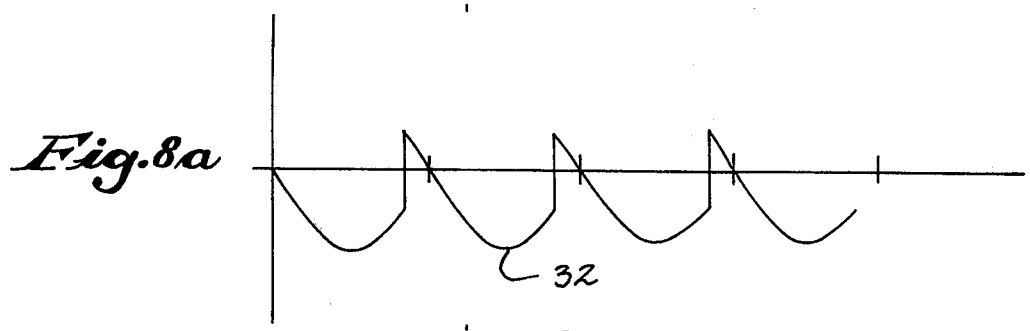
FIGS. 8a and 8b are schematic representations of the current control circuit output signal at yet another generator load condition and the resultant visual display.
Figure 8B:
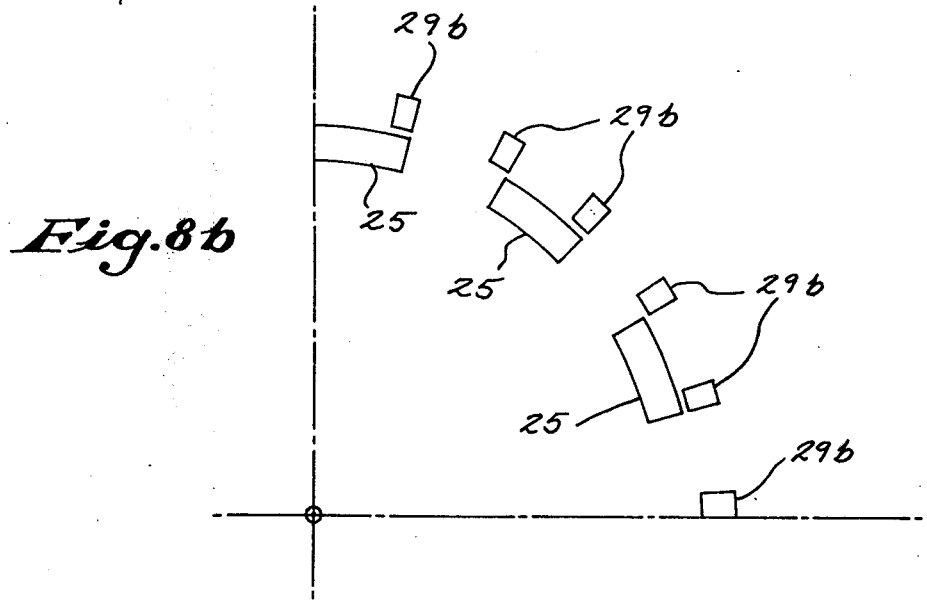

When a load is suddenly removed from the brushless a-c generator the feedback signal from the transceiver 8 controls the firing of the SCRs in the current control circuit 5 to briefly generate a substantially negative voltage waveform 32 as shown in FIG 8a. When the generator system is operating properly, therefore, the output monitor circuit 11 will momentarily generate a light pattern comprised of a series of equally spaced light segments 29b of very short duration as shown in FIG. 8b when a sudden decrease in generator load occurs. As the generator system reacts to reestablish a steady-state, no-load operating condition, the length of light segments 29B will increase until they reach the length of light segments 29 in FIG. 6.

It should be apparent, therefore, that by observing the spacing and duration of the light segments generated by the input and output monitor circuits 10 and 11 one can readily determine whether the exciter winding 3 is supplying a suitable voltage waveform and whether the feedback control circuitry is reacting properly to changes in generator load.

The concentric, circular light pattern which results from the radial displacement of the LEDs 12 and the directing of the light which they emit in the axial direction is particularly useful as illustrated by the above description. However, information can also be obtained by displacing the two LEDs 12 axially from one another and directing their emitted light radially outward. The observer would then stand to the side of the machine and look radially inward and he obviously would not see all of the light segments generated by each LED 12, but only a select few. Nevertheless, a great deal of information can be obtained concerning the operation of the brushless generator system even from a single light segment pair.

It should be apparent to those skilled in the art that numerous variations can be made in the preferred embodiment described herein without departing from the spirit of the invention. The monitor circuits 10 and 11 can be modified in a number of ways. For example, a capacitor can be added to filter voltage fluctuations and thus make the light emitted by the LED 12 more constant. Also, a resistor may be connected in parallel with LED 12 or additional diodes connected in series with it to alter the threshold voltage at which the LED 12 begins to emit light. Also, the waveforms applied to the monitor circuits 10 and 11 may be full wave rectified before application to the LEDs 12. And finally, the usefulness of the present invention is clearly not limited to brushless a-c generators. It may also be applied to other rotating machinery such as motors, generators and engines.

I claim:

1. In an electrical generator having a shaft which rotates about an axis and a winding rotating with said shaft for generating a periodic voltage which is synchronized with the rotation of said shaft, a monitoring circuit comprising:
    a light source mounted to said shaft for rotation about said axis; and
    means connecting said light source to said winding to apply the periodic voltage thereto,
    wherein said light source is spaced radially outward from said axis of rotation and is responsive to said applied periodic voltage to generate a substantially stationary light pattern under steady-state conditions which varies in intensity as a function of circumferential distance about said axis of rotation.

2. In an electrical generator having a shaft which rotates about an axis and a winding mounted on said shaft for generating a periodic voltage which is synchronized with the rotation of said shaft, a monitoring circuit the combination comprising:
    a light source mounted to said shaft to rotate therewith, said light source being disposed radially outward from said axis of rotation and being oriented to direct light along said axis of rotation when energized; and
    means connecting said light source to said winding to apply the periodic voltage thereto such that said light source is periodically energized by said applied voltage in synchronism with the rotation of said shaft to generate a circular light pattern about said axis of rotation which is substantially stationary under steady-state operating conditions.

3. The monitoring circuit as recited in claim 2, wherein said light source is a light emitting diode which becomes energized when the applied periodic voltage reaches a threshold magnitude.

4. In a rotating machine having a shaft which rotates about an axis and means mounted on said shaft for generating a periodic voltage which is synchronized with the rotation of said shaft, a monitoring circuit the combination comprising:
    a light source mounted to said shaft to rotate therewith, said light source being disposed radially outward from said axis of rotation and being oriented to direct light along said axis of rotation when energized;
    means connecting said light source to said generating means to apply the periodic voltage thereto such that said light source is periodically energized by said applied voltage in synchronism with the rotation of said shaft to generate a circular light pattern about said axis of rotation which is substantially stationary under steady-state operating conditions; and
    a rectifier connected in series with said light source to block portions of said applied periodic voltage and to thereby periodically deenergize said light source.

5. The monitoring circuit as recited in claim 4 in which said light source is a light emitting diode.

6. In an a-c generator having a current control circuit which mounts to a rotating shaft, which connects to receive a periodic voltage at a pair of input terminals and which generates a transformed periodic voltage at a pair of output terminals, a monitoring circuit comprising:
- a first light source which mounts to the shaft at a point which is spaced radially outward from the shaft's axis of rotation and which directs light to a stationary observer when energized;
- first means connecting said first light source to said control circuit input terminals to periodically energize said first light source in synchronism with said periodic voltage;
- a second light source which mounts to the shaft at a point which is spaced radially outward from said axis and which directs light when energized in substantially the same direction as said first light source; and
- second means connecting said second light source to said control circuit output terminals to periodically energize said second light source in synchronism with said transformed periodic voltage.

7. The monitoring circuit as recited in claim 6 in which said second light source is spaced radially from said first light source and the light emitted by both of said light sources is observable by an observer alinged substantially along the axis of rotation of said shaft.

8. The monitoring circuit as recited in claim 6 in which a rectifier is connected to each of said light sources to periodically block portions of the periodic voltage applied thereto.

9. The monitoring circuit as recited in claim 8 in which each of said light sources is a light emitting diode.

10. In an a-c generator having a current control circuit which mounts to a rotating shaft, which connects to receive a voltage waveform from a rotating exciter winding at a pair of input terminals and which generates a transformed voltage waveform at a pair of output terminals to a rotating field winding, means for monitoring the operation of said rotating elements comprising:
- an output monitor circuit mounted for rotation on said shaft and electrically connected to said current control circuit output terminals, said output monitor circuit including a light emitting diode which is connected to receive said transformed voltage waveform and to generate a series of light segments in response thereto which are observable by a stationary observer; and
- an input monitor circuit mounted for rotation on said shaft and electrically connected to said current control circuit input terminals, said input monitor circuit including a light emitting diode which is connected to receive said voltage waveform and to generate a series of light segments in response thereto which are observable by a stationary observer.

11. The monitoring means as recited in claim 10 in which said light emitting diodes are mounted to direct light along the axis of rotation of said shaft and one is mounted radially outward of the other, wherein a pair of concentric, circular light patterns comprised of said light segments are generated to said stationary observer.

12. The monitoring means as recited in claim 11 in which said voltage waveform and said transformed voltage waveform are synchronized with the shaft rotation.

13. The monitoring means as recited in claim 10 in which said input and output monitor circuits each include a rectifier connected in series with their respective light emitting diodes.